United States Patent
Weng et al.

(10) Patent No.: US 11,990,889 B2
(45) Date of Patent: May 21, 2024

(54) BULK ACOUSTIC WAVE RESONATOR AND FORMATION METHOD THEREOF

(71) Applicant: WIN SEMICONDUCTORS CORP., Taoyuan (TW)

(72) Inventors: Kuo-Lung Weng, Taoyuan (TW); Chia-Ta Chang, Taoyuan (TW); Tzu-Sheng Hsieh, Taoyuan (TW); Chun-Ju Wei, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 652 days.

(21) Appl. No.: 17/134,681

(22) Filed: Dec. 28, 2020

(65) Prior Publication Data

US 2022/0209741 A1   Jun. 30, 2022

(51) Int. Cl.
*H03H 9/17* (2006.01)
*H03H 3/02* (2006.01)
*H03H 9/02* (2006.01)
*H03H 9/13* (2006.01)

(52) U.S. Cl.
CPC ............ *H03H 9/172* (2013.01); *H03H 3/02* (2013.01); *H03H 9/02015* (2013.01); *H03H 9/131* (2013.01)

(58) Field of Classification Search
CPC ..... H03H 9/172; H03H 9/02015; H03H 9/131
See application file for complete search history.

(56) References Cited

U.S. PATENT DOCUMENTS

| | | |
|---|---|---|
| 6,662,419 B2 | 12/2003 | Wang et al. |
| 6,828,713 B2 | 12/2004 | Bradley et al. |
| 2006/0270090 A1* | 11/2006 | Bradley .............. H03H 9/02149 438/48 |
| 2011/0304412 A1 | 12/2011 | Zhang |
| 2012/0096697 A1 | 4/2012 | Grannen et al. |
| 2012/0319534 A1 | 12/2012 | Shirakawa et al. |
| 2013/0063227 A1* | 3/2013 | Burak ................. H03H 9/02118 333/187 |
| 2014/0225683 A1* | 8/2014 | Burak .................... H03H 9/173 333/187 |
| 2017/0288636 A1 | 10/2017 | Zou et al. |
| 2019/0333965 A1* | 10/2019 | Campanella-Pineda ..................... H01L 21/0254 |
| 2020/0152858 A1 | 5/2020 | Moe et al. |

FOREIGN PATENT DOCUMENTS

TW    201707375 A    2/2017

OTHER PUBLICATIONS

TW Notice of Allowance dated Dec. 29, 2022 in Taiwan application No. 110127679.
Search Report issued in TW Notice of Allowance dated Dec. 29, 2022 in Taiwan application No. 110127679.

* cited by examiner

*Primary Examiner* — Samuel S Outten
(74) *Attorney, Agent, or Firm* — McClure, Qualey & Rodack, LLP

(57) ABSTRACT

A bulk acoustic wave resonator and a formation method thereof are provided. The method for forming the bulk acoustic wave resonator includes forming a sacrificial structure on a substrate. A seed layer is formed on the sacrificial structure. A bottom electrode is formed on the seed layer. A piezoelectric layer is formed on the bottom electrode. A top electrode is formed on the piezoelectric layer. The sacrificial structure is removed to form a cavity. The seed layer is etched through the cavity.

18 Claims, 8 Drawing Sheets

BULK ACOUSTIC WAVE RESONATOR AND FORMATION METHOD THEREOF

TECHNICAL FIELD

Some embodiments of the present disclosure relate to a bulk acoustic wave resonator and a formation method thereof, and, in particular, to a bulk acoustic wave resonator having an opening in a seed layer and formation method thereof.

BACKGROUND

In order to meet user demand for high-frequency selectivity, large bandwidth, and low acoustic loss, filters that are able to separate signals into various frequency bands have been developed thanks to recent development in wireless communication technology. Currently, ordinary filters may include surface acoustic wave resonators (SAWR) and bulk acoustic wave resonators (BAWR). In BAWR, since the characteristics of the thin film bulk acoustic wave resonator (FBAR) mainly depend on the film thickness and the overall structure, adjustments to the FBAR can be easily made to the technical details related to thin film growth. The FBAR is widely used in various applications.

Although ordinary resonator structures have generally met the requirements for their intended uses, these ordinary resonator structures have not been fully satisfactory in all respects (e.g., the quality factor needs to be improved). Thus, there are still some problems to be solved regarding resonator structures for which a higher performance is sought, as well as the methods of forming said structures.

SUMMARY

In view of the above problems, some embodiments of the present disclosure include seed layer having an opening, in order to improve the quality factor and the reliability of the bulk acoustic wave resonator including the seed layer.

According to some embodiments, a method for forming a bulk acoustic wave resonator is provided. The method for forming the bulk acoustic wave resonator includes forming a sacrificial structure on a substrate. A seed layer is formed on the sacrificial structure. A bottom electrode is formed on the seed layer. A piezoelectric layer is formed on the bottom electrode. A top electrode is formed on the piezoelectric layer. The sacrificial structure is removed to form a cavity. The seed layer is etched through the cavity.

According to some embodiments, a bulk acoustic wave resonator is provided. The bulk acoustic wave resonator includes a substrate, a seed layer, a bottom electrode, a piezoelectric layer, and a top electrode. The seed layer is disposed on the substrate. The bottom electrode is disposed on the seed layer. The piezoelectric layer is disposed on the bottom electrode. The top electrode is disposed on the piezoelectric layer. The substrate has a cavity thereon. The seed layer has an opening exposing the bottom surface of the bottom electrode and communicating with the cavity.

According to some embodiments, the bulk acoustic wave resonators are used in various types of electronic devices (e.g., filters and duplexers). In some embodiments, the bulk acoustic wave resonator is used in ladder-type filters. In order to make the features and advantages of the present disclosure more easily understood, some embodiments of the present disclosure are listed below in conjunction with the accompanying drawings, and are described in detail as follows.

BRIEF DESCRIPTION OF THE DRAWINGS

Through the following detailed description and the accompanying drawings, a person of ordinary skill in the art will better understand the viewpoints of some embodiments of the present disclosure. It should be noted that, in accordance with standard practice in the industry, various features are not drawn to scale and are used for illustration purposes only. In fact, the dimensions of the various features may be arbitrarily increased or reduced for clarity of discussion.

DETAILED DESCRIPTION

Figure 1:
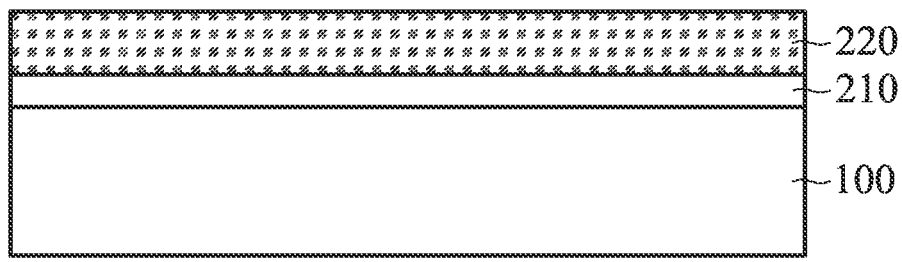
FIGS. 1-9 are schematic cross-sectional views of a bulk acoustic wave resonator at various stages of fabrication, according to some embodiments of the present disclosure.

The following disclosure provides many different embodiments or examples for implementing different features of the bulk acoustic wave resonator disclosed herein. Specific examples of each feature and its configuration are described below to simplify the embodiments of the present disclosure. Naturally, these are only examples and are not intended to limit the present disclosure. For example, if the description mentions that the first feature is formed on the second element, it may refer to an embodiment in which the first feature and second feature are in direct contact, or it may refer to an embodiment in which additional features are formed between the first feature and the second feature, and wherein the first feature and the second feature are not in direct contact. In addition, some embodiments of the present disclosure may repeat reference numerals and/or letters in different examples. Such repetition is for conciseness and clarity, and is not used to indicate a relationship between the different embodiments and/or aspects discussed herein.

Some modifications of the embodiment are described below. In the different accompanying drawings and illustrated embodiments, reference numerals that are similar or the same are used to identify features that are similar or the same. It should be understood that additional operations and/or processes may be provided before, during, and after the method disclosed herein, and some of the described operations in some embodiments may be deleted or replaced with other embodiments of the method.

Furthermore, spatially relative terms, for example, "on", "over", "upper", "lower", "above", "below" or the like are used for ease of the present disclosure of one features relationship to another feature. The spatially relative terms are intended to encompass different orientations of the feature in use or operation, in addition to the orientation depicted in the accompanying drawings. The features may be otherwise oriented (e.g., rotated 90 degrees or other orientations) and the spatially relative terms used herein should be interpreted accordingly.

Hereinafter, the terms "about", "approximately", and "substantially" usually mean within ±20% of a given value or a given range, for example, within ±10%, within 5%, within 3%, within 2%, within 1%, or within 0.5%. It should be noted that, the value provided in the specification is an approximate value, that is, without specific description of "about", "approximately", and "substantially", the meanings of the terms may still be implied.

Various embodiments generally relate to bulk acoustic wave resonators and formation methods thereof, and more particularly to bulk acoustic wave resonators having an opening in a seed layer and formation methods thereof. The bulk acoustic wave resonator may include a substrate having a cavity and a seed layer having an opening exposing a bottom surface of a bottom electrode and communicating with the cavity. Therefore, the performance of the bulk acoustic wave resonator may be improved.

FIGS. 1-9 are schematic cross-sectional views of a bulk acoustic wave resonator 10 at various stages of fabrication, according to some embodiments of the present disclosure.

Referring to FIG. 1, in some embodiments, a substrate 100 is provided, and a first sacrificial layer 210 and a second sacrificial layer 220 are formed on the substrate 100. In some embodiments, the first sacrificial layer 210 is disposed between the substrate 100 and the second sacrificial layer 220. However, in some other embodiments, the first sacrificial layer 210 is omitted, and the second sacrificial layer 220 is directly formed on the substrate 100.

The substrate 100 may be, or include, a bulk semiconductor substrate, a semiconductor-on-insulator (SOI) substrate, or the like. The substrate 100 may be doped, for example, using p-type dopants or n-type dopants or undoped. In general, the semiconductor-on-insulator substrate includes a film layer of semiconductor material formed on the insulating layer. For example, the insulating layer may be a silicon oxide layer, a silicon nitride layer, a poly-silicon layer, a combination thereof, or a stack of the foregoing film layers. The insulating layer is disposed on a substrate, such as silicon (Si) substrate. Other substrates may also be used, such as a multilayer substrate or a gradient substrate. In some embodiments, the semiconductor material of the substrate 100 includes silicon with different crystal planes. In some embodiments, the substrate 100 is a gallium arsenide (GaAs) substrate, a gallium nitride (GaN) substrate, a silicon carbide (SiC) substrate, an aluminum nitride (AlN) substrate, or a sapphire substrate.

In some embodiments, the first sacrificial layer 210 and/or the second sacrificial layer 220 is (or includes) sacrificial materials which may be removed in the subsequent process. For example, the sacrificial materials may be a binary compound semiconductor, such as GaAs; a ternary compound semiconductor, such as indium gallium phosphide (InGaP), indium gallium arsenide (InGaAs); a quaternary compound semiconductor, such as aluminum gallium indium phosphide (AlInGaP), the like, another suitable sacrificial material, or a combination thereof, but the present disclosure is not limited thereto. The first sacrificial layer 210 and the second sacrificial layer 220 may be made of different materials. In some embodiments, the first sacrificial layer 210 and the second sacrificial layer 220 have different etching rates. In some embodiments, the first sacrificial layer 210 is made of InGaP and the second sacrificial layer 220 is made of GaAs.

For example, the first sacrificial layer 210 and/or the second sacrificial layer 220 may be formed by a deposition process. The deposition process may be metal organic chemical vapor deposition (MOCVD), atomic layer deposition (ALD), molecular beam epitaxy (MBE), liquid phase epitaxy (LPE), the like, another suitable process, or a combination thereof, but the present disclosure is not limited thereto.

Figure 2:
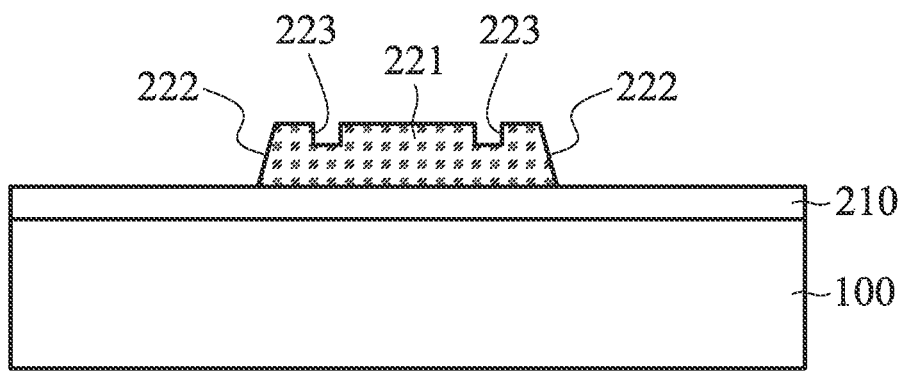

Referring to FIG. 2, in some embodiments, the second sacrificial layer 220 is patterned to form a sacrificial structure 221 on the substrate 100. The sacrificial structure 221 may be platform-shape, island-shape, mesa-shape or another suitable shape when observed in the cross-sectional view. In some embodiments, the first sacrificial layer 210 exposed by the sacrificial structure 221 is bombarded by ion implantation to adjust its conductive feature.

In some embodiments, the sacrificial structure 221 is formed by a lithography process followed by an etching process. In some embodiments, the first sacrificial layer 210 serves as an etch stop layer in the etching process for forming the sacrificial structure 221. In some embodiments, the sacrificial structure 221 has tapered sidewalls 222 by adjusting the etching parameters of the etching process.

In some embodiments, the sacrificial structure 221 has a trench 223 on its top surface. In some embodiments, the trench 223 is located on the top surface of the sacrificial structure 221. The trench 223 may be formed by a lithography process followed by an etching process.

In some embodiments, the trench 223 on the sacrificial structure 221 is ring-shaped when observed in the top view. The shape of the region surrounded by the trench 223 may be the shape of the subsequently formed opening in the seed layer. In some embodiments, the trench 223 on the sacrificial structure 221 has a depth that corresponds to the thickness of subsequently formed material in the trench 223. It should be noted that the ring-shaped trench 223 of the sacrificial structure 221 may be used to define a frame (or at least a portion of the frame) trapping the energy within an active region of the bulk acoustic wave resonator. The details will be discussed later.

Figure 3:
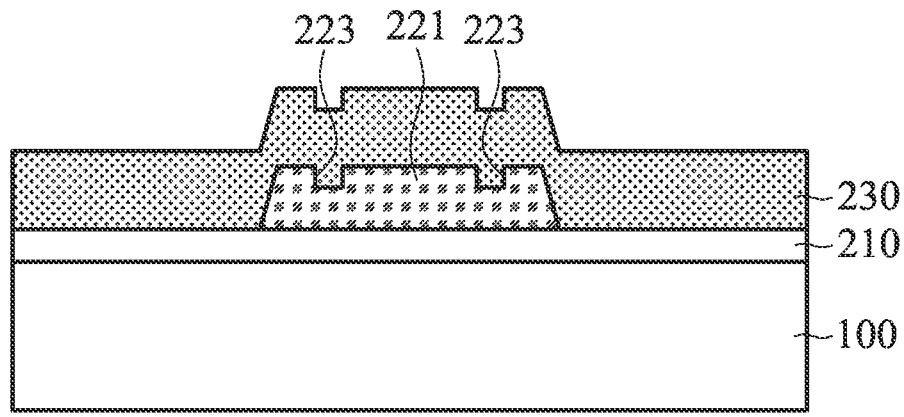

Referring to FIG. 3, in some embodiments, a supporting layer 230 is formed on the sacrificial structure 221 and the first sacrificial layer 210. The supporting layer 230 may be conformally formed on the first sacrificial layer 210 and the sacrificial structure 221 by the deposition process. In some embodiments, the supporting layer 230 fills into the trench 223. In some embodiments, the trench 223 is filled with a portion of the supporting layer 230, and the portion of the supporting layer 230 is remained in the trench 223 in the subsequent process. The deposition process for forming the supporting layer 230 may be CVD, ALD, the like, another suitable process, or a combination thereof, but the present disclosure is not limited thereto. In some embodiments, the supporting layer 230 is (or includes) nitride, oxide, oxynitride, polymer, the like, another suitable material, or a combination thereof, but the present disclosure is not limited thereto. In some embodiments, the supporting layer 230 is silicon nitride or silicon oxide.

Figure 4:
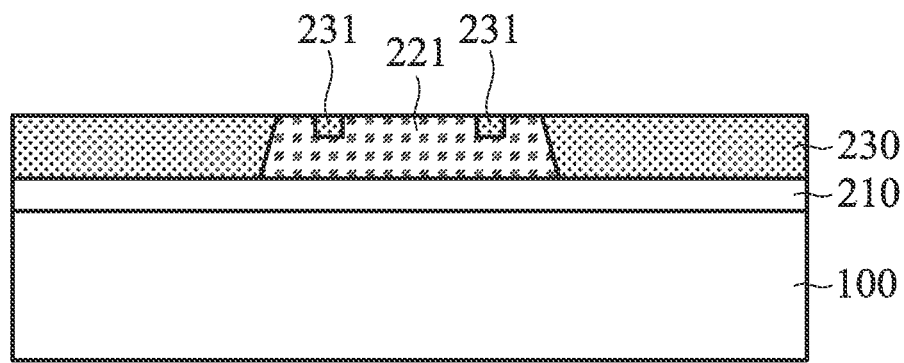

Referring to FIG. 4, in some embodiments, the supporting layer 230 is planarized to expose a top surface of the sacrificial structure 221. In some embodiments, a portion of the supporting layer 230 on the sacrificial structure 221 is removed to expose the top surface of the sacrificial structure 221, and another portion of the supporting layer 230 remains in the trench 223 and can be referred to as a frame element 231. The planarization process may be a chemical mechanical polishing (CMP) process. In some embodiments, after performing a planarization process, a top surface of the supporting layer 230 and a top surface of the sacrificial structure 221 are substantially coplanar.

In some other embodiments, the first sacrificial layer 210 is omitted, the sacrificial structure 221 is directly on the substrate 100, and the supporting layer 230 is directly on the substrate 100 and integrated with the substrate 100. For example, the substrate 100 and the supporting layer 230 may be integrated formed as a base, and then an opening for forming the sacrificial structure 221 therein is formed in the base followed by forming the sacrificial structure 221 in the opening.

Figure 5:
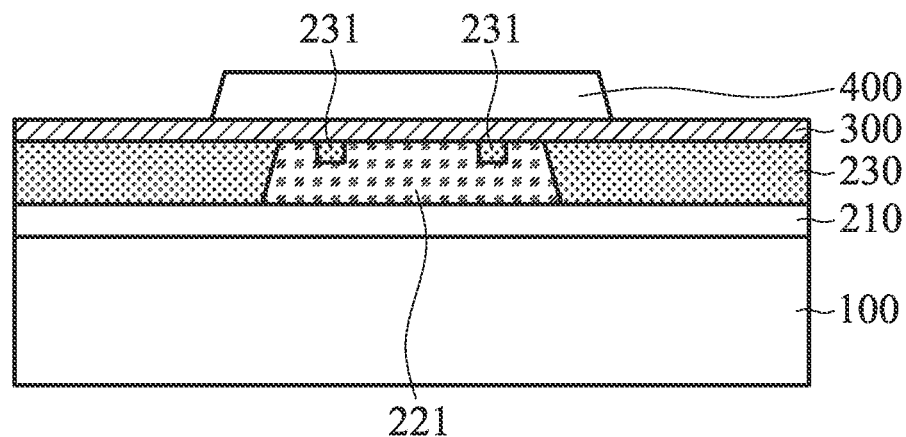

Referring to FIG. 5, in some embodiments, a seed layer 300 is formed on the supporting layer 230 and the sacrificial structure 221. The seed layer 300 may improve the quality of the layers that are formed on the seed layer 300 due to the reduced mismatch between the seed layer 300 and the layers that are formed on the seed layer 300. In some embodiments, the seed layer 300 is (or includes) aluminum nitride (AlN), aluminum oxynitride (AlON), silicon dioxide ($SiO_2$), silicon nitride ($Si_3N_4$), SiC, aluminum scandium nitride (AlScN), titanium (Ti), the like, another suitable material, or a combination thereof. In some embodiments, the material of the seed layer 300 is the same as the material of the subsequently formed piezoelectric layer. In some embodiments, the seed layer 300 and the supporting layer 230 are made of different materials. In some embodiments, the seed layer 300 is formed by a deposition process. The deposition process may be physical vapor deposition (PVD, e.g., sputtering), ALD, the like, another suitable process, or a combination thereof, but the present disclosure is not limited thereto. In some embodiments, the seed layer 300 is doped with transition elements (e.g., Sc).

Still referring to FIG. 5, in some embodiments, a bottom electrode 400 is formed on the top surface of the seed layer 300. In some embodiments, the bottom electrode 400 is (or includes) a conductive material such as a metal. In some embodiments, the metal includes titanium (Ti), molybdenum (Mo), platinum (Pt), aluminum (Al), gold (Au), tungsten (W), ruthenium (Ru), the like, or a combination thereof.

In some embodiments, the bottom electrode 400 is formed by the deposition process. The deposition process may be PVD (e.g., sputtering), electroplating, the like, another suitable process, or a combination thereof, but the present disclosure is not limited thereto. For example, the material of the bottom electrode 400 is deposited on the seed layer 300 and is patterned to form the bottom electrode 400 with vertical sidewalls or tapered sidewalls. In some embodiments, the bottom electrode 400 is directly above the sacrificial structure 221. In some embodiments, an area where the sacrificial structure 221 is projected onto the substrate 100 is in an area where the bottom electrode 400 is projected onto the substrate 100.

Figure 6:
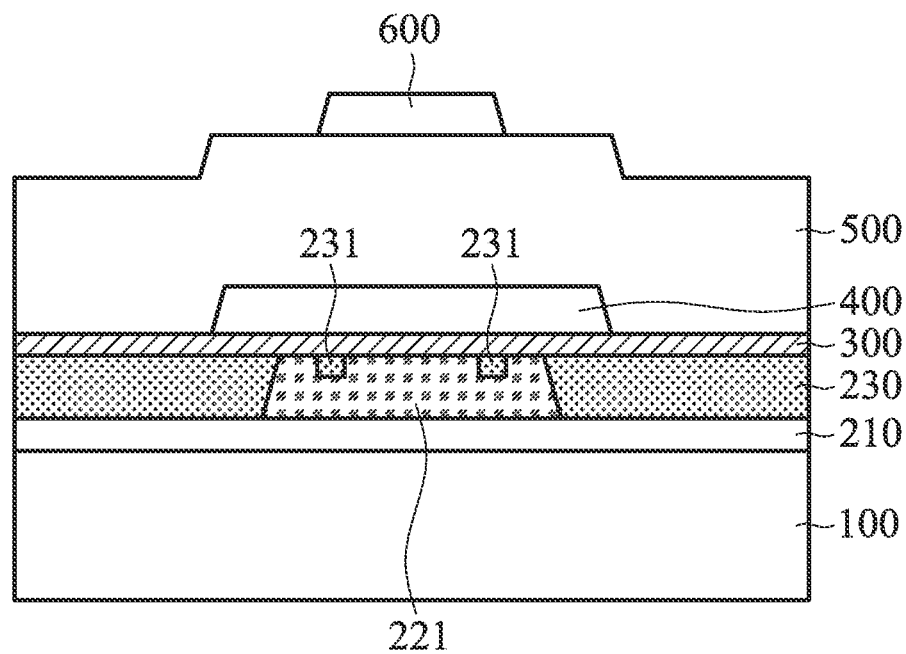

Referring to FIG. 6, in some embodiments, a piezoelectric layer 500 is formed on a top surface of the bottom electrode 400. In some embodiments, the piezoelectric layer 500 is (or includes) AlN, AlScN, the like, another suitable material, or a combination thereof. In some embodiments, the piezoelectric layer 500 is conformally formed on the top surface of the seed layer 300 and the top surface of the bottom electrode 400. The quality of the piezoelectric layer 500 may be improved since the piezoelectric layer 500 is formed on the bottom electrode 400 formed on the seed layer 300. In some embodiments, the piezoelectric layer 500 is doped to improve its electromechanical coupling coefficient. The dopants used in the seed layer 300 may be the same as or different than that of the piezoelectric layer 500. In some embodiments, the piezoelectric layer 500 is doped with scandium. The piezoelectric layer 500 may be formed by a deposition process (e.g., sputtering).

Still referring to FIG. 6, in some embodiments, a top electrode 600 is formed on a top surface of the piezoelectric layer 500. The top electrode 600 and the bottom electrode 400 may be made of the same or different materials. The material and the formation method of the top electrode 600 may be the same as or similar to those of the bottom electrode 400, and the details are not repeated herein.

In some embodiments, the top electrode 600 is directly above the bottom electrode 400. In some embodiments, an area of the bottom electrode 400 is larger than an area of the top electrode 600 to make it easy to align the bottom electrode 400 and the top electrode 600.

In some embodiments, the piezoelectric layer 500 is sandwiched between the top electrode 600 and the bottom electrode 400, since the top electrode 600 and the bottom electrode 400 are used to electrically connect with an external circuit.

Figure 7:
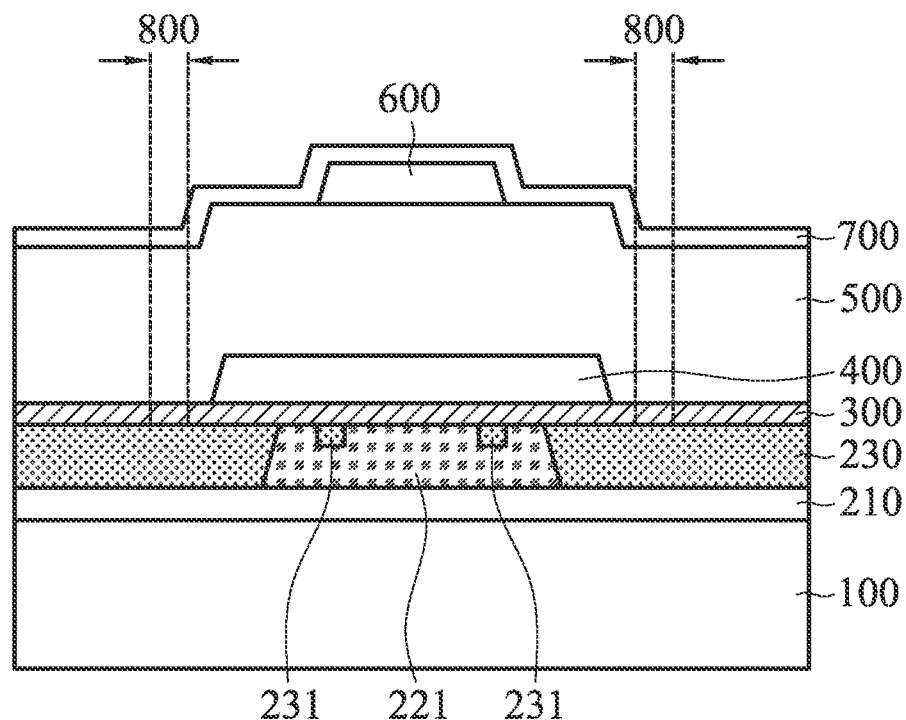

Referring to FIG. 7, in some embodiments, a passivation layer 700 is formed on the top electrode 600. In particular, the passivation layer 700 is formed on the top electrode 600 and the piezoelectric layer 500 to protect the underlying features. In some embodiments, the passivation layer 700 is conformally formed on the top electrode 600 and the piezoelectric layer 500 to improve the protective effect. In some embodiments, the passivation layer 700 is (or includes) nitride, oxide, oxynitride, polymer, the like, combination thereof, or another suitable material having a high etching resistance, but the present disclosure is not limited thereto.

Figure 8:
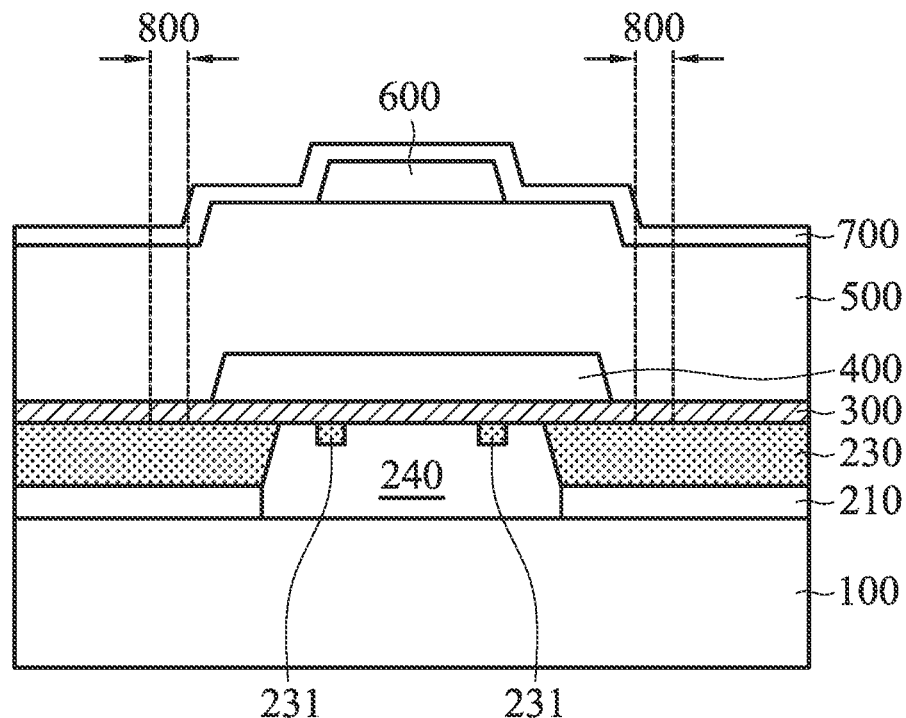

Referring to FIG. 8, in some embodiments, the sacrificial structure 221 is removed through via holes 800 to form a cavity 240. The via holes 800 may also be referred to as an etch channel since the etchant may reach and etch the sacrificial structure 221 through the via holes 800. The via holes 800 may be formed by etching the uppermost features of the bulk acoustic wave resonator until reaching the sacrificial structure 221. Thus, the uppermost features of the bulk acoustic wave resonator are etched from a top side of the substrate 100. In some embodiments, the etching process is performed from the top side of the resonator to form the via holes 800, and is referred to as a top-down etching process. In some embodiments, the frame element 231 is left during removal of the sacrificial structure 221 to form the cavity 240. The cavity 240 may be directly below the top electrode 600 and the bottom electrode 400 and on the substrate 100. In some embodiments, the active region of the bulk acoustic resonator is the region where the cavity 240, the bottom electrode 400, the piezoelectric layer 500, and the top electrode 600 overlap. In some embodiments, the via holes 800 connect with the sacrificial structure 221 for removing the sacrificial structure 221. A detailed description of the via holes 800 is provided below.

In some embodiments, the via holes 800 bypasses the bottom electrode 400 and the top electrode 600 and extends into the sacrificial structure 221 through the passivation layer 700 and the piezoelectric layer 500, for improving the conductivity of the bottom electrode 400 and the top electrode 600. In some embodiments, the via holes 800 extend into the sacrificial structure 221 through the passivation layer 700, the piezoelectric layer 500, and/or the bottom electrode 400 and/or the top electrode 600.

In some embodiments, the sacrificial structure 221 is removed by a wet etching process using an etchant. In some embodiments, the etchant is (or includes) an acidic etchant, an alkaline etchant, or a combination thereof. For example, the acidic etchant includes solutions of acidic compounds, such as hydrofluoric acid, hydrochloric acid, chloric-based acid, bromic-based acid, iodic-based acid, sulfuric acid, sulfurous acid, hyposulfurous acid, nitric acid, nitrous acid, phosphoric acid, phosphorous acid, phosphinic acid, boric acid, tetrafluoroboric acid, formic acid, acetic acid, propionic acid, butanoic acid, trifluoroacetic acid, oxalic acid, lactic acid, methanesulfonic acid, p-toluene sulfonic acid, trifluoromethane sulfonic acid, and fluorosulfonic acid, the like or combination thereof. For example, the alkaline etchant includes an organic alkaline solution or an alkaline compound, such as cyclohexylamine, ethylenediamine, ammonia, tetramethylammonium hydroxide, tetraethylammonium hydroxide, sodium hydroxide, potassium hydroxide, magnesium hydroxide, calcium hydroxide, sodium carbonate, potassium carbonate, and ammonia solution. In some embodiments, a portion of the first sacrificial layer 210 under the sacrificial structure 221 is removed while the sacrificial structure 221 is removed. However, in some other embodiments, the first sacrificial layer 210 has a higher etch resistance than that of the sacrificial structure 221, and thus the first sacrificial layer 210 is not removed while the sacrificial structure 221 is removed.

Figure 9:
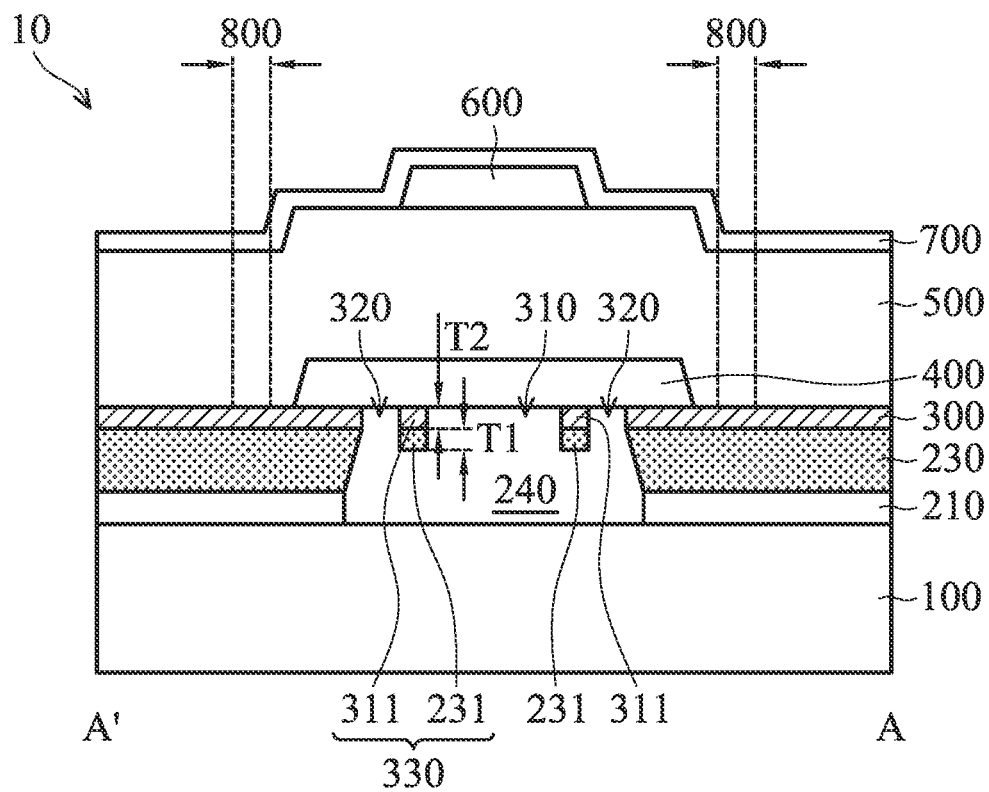

Referring to FIG. 9, in some embodiments, the seed layer 300 is etched through the cavity 240. The etchant for etching the seed layer 300 may enter the cavity 240 through the via holes 800 and then etch the seed layer 300. In some embodiments, the bottom electrode 400 is used as an etch stop layer during the etching of the seed layer 300. In some embodiments, the frame element 231 is used as an etch mask during the etching of the seed layer 300 through the cavity 240 to form openings 310, 320 in the seed layer 300. In detail, the pattern of the frame element 231 may be transferred into the seed layer 300 so as to form a patterned seed layer 300 including openings 310, 320 therein. In some embodiments, a portion of the seed layer 300 is removed to form openings 310, 320, and another portion of the seed layer 300 is left behind. In some embodiments, the portion of the seed layer 300 that remains under the bottom surface of the bottom electrode 400 is referred to as a frame element 311. The frame element 311 may be between the frame element 231 and the bottom electrode 400. A detailed description of the arrangement of the openings 310, 320, and the frame element 311 is provided below.

In some embodiments, the etching process used for etching the seed layer 300 is the same as or different than the etching process used for removing the sacrificial structure 221. In some embodiments, the etching process for etching the seed layer 300 is an anisotropic etching process, so as to prevent the frame element 231 and the frame element 311 from peeling off from the bulk acoustic wave resonator. In some embodiments, the seed layer 300 is removed by a wet etching process using the etchant to remove the sacrificial structure 221. In some embodiments, etching the seed layer 300 through the cavity 240 and etching the sacrificial structure 221 to form the cavity 240 through the via holes 800 are performed in the same process to reduce the manufacturing cost, or are continuously performed in different processes. In some embodiments, the seed layer 300 is etched through the cavity 240 after the formation of the bottom electrode 400 and/or the top electrode 600.

In some embodiments, the openings 310, 320 expose the bottom surface of the bottom electrode 400. In some embodiments, the shape of the opening 310 corresponds to the frame element 311, and in particular, it is the same as the shape of the region surrounded by the frame element 311. For example, the shape of the opening 310 may be a circle, rectangle, polygon, irregular shape, or the like when observed from a top view. In some embodiments, the opening 310 is in communication with the cavity 240 to form a cavity having a volume that is larger than that of the cavity 240.

In some embodiments, the opening 310 is located between sidewalls of the bottom electrode 400 and/or sidewalls of the top electrode 600 when observed in the cross-sectional view. In some embodiments, an area surrounded by the frame element 311 and projected onto the substrate 100 is in an area where the bottom electrode 400 is projected onto the substrate 100. In some embodiments, the area surrounded by the frame element 311 and projected onto the substrate 100 is in an area where the bottom electrode 400, the piezoelectric layer 500, and top electrode 600 overlap. In some embodiments, the area surrounded by the frame element 311 and projected onto the substrate 100 is in the active region of the bulk acoustic wave resonator projected onto the substrate 100.

As shown in FIG. 9, in some embodiments, the frame element 311 and the frame element 231 are connected to each other. The frame element 311 and the frame element 231 may be referred to as a frame 330. In some embodiments, the frame 330 includes a first portion (e.g., the frame element 231) and a second portion (e.g., the frame element 311) disposed between the first portion and the bottom electrode 400. In some embodiments, since the frame element 231 and the frame element 311 are made of different materials, the first portion and the second portion included in the frame 330 are made of different materials. In some embodiments, the frame 330 can trap the acoustic wave inside the active region of the bulk acoustic wave resonator, improving the quality factor of the bulk acoustic wave resonator. In some embodiments, the frame 330 is directly below the active region of the bulk acoustic wave resonator.

As shown in FIG. 9, in some embodiments, the frame element 231 has a first thickness T1 and the frame element 311 has a second thickness T2, and a ratio of first thickness T1 to second thickness T2 is in a range between about 0.2 and 15. In some embodiments, the frame element 231 with the first thickness T1 is made of silicon nitride, the frame element 311 with the second thickness T2 is made of aluminum nitride. The materials of the frame elements 311 and 231, and the ratio of first thickness T1 to second thickness T2 may be adjusted to improve the performance of the bulk acoustic wave resonator.

In some embodiments, the quality of the piezoelectric layer 500 is improved since the piezoelectric layer 500 is formed on the bottom electrode 400 formed on the seed layer 300. However, the seed layer 300 may degrade the quality factor and/or the electromechanical coupling coefficient of the bulk acoustic wave resonator. Embodiments of the present disclosure selectively remove the seed layer 300 in the active region of the bulk acoustic wave resonator after the formation of the bottom electrode 400 and the piezoelectric layer 500. Therefore, the quality factor and/or the electromechanical coupling coefficient of the bulk acoustic wave resonator may be improved.

In some embodiments, the bulk acoustic wave resonator having an opening in the seed layer serves as the resonator in a filter (e.g., a Tx filter or a Rx filter). In some embodiments, the bulk acoustic wave resonator having an opening in the seed layer serves as the series resonator or the shunt resonator in a ladder-type filter. The performance of the filters may be improved by utilizing the bulk acoustic wave resonator having an opening in the seed layer as the resonators in the filters.

Figure 10:
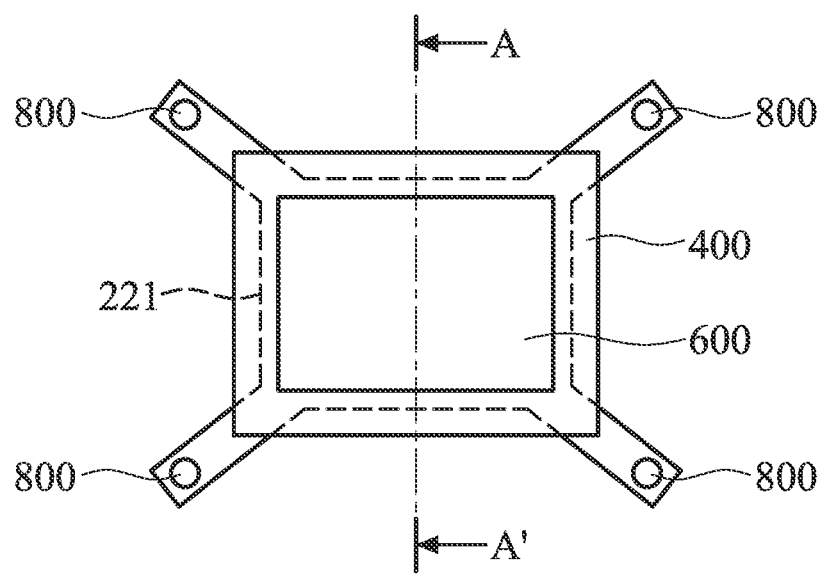
FIG. 10 is a schematic top view of a bulk acoustic wave resonator, according to some embodiments of the present disclosure.

FIG. 10 is a schematic top view of a bulk acoustic wave resonator 10, according to some embodiments of the present disclosure.

Referring to FIG. 10, which is an aspect of the top view of the bulk acoustic wave resonator shown in FIG. 9, and which illustrates the sacrificial structure 221, the bottom electrode 400, the top electrode 600, and the via holes 800 and omits other features for ease of illustration. FIG. 9 is a cross-sectional view of the bulk acoustic wave resonator shown in FIG. 10 taken along sectional line A-A'.

In some embodiments, as shown in FIG. 10, the sacrificial structure 221 has an extending part outside the edges of the bottom electrode 400 and the top electrode 600, and the via holes 800 is disposed on the region of the sacrificial structure 221 outside the bottom electrode 400 and the top electrode 600. Thus, the bottom electrode 400 and the top electrode 600 in the active region are not damaged by the etchant passing through the via holes 800. The extending part of the sacrificial structure 221 may be any shape based on the requirements. In some embodiments, the number of the via holes 800 is adjusted based on the desired removing rate for removing the sacrificial structure 221 or the shape of the extending part of the sacrificial structure 221. In some embodiments, arrangements of the via holes 800, the bottom electrode 400 and the top electrode 600 are adjusted based on the requirement.

Referring to FIGS. 11-14, which are cross-sectional views of the bulk acoustic wave resonators in accordance with some other embodiments of the present disclosure. A via hole 810 for etching the sacrificial structure 221 and etching the seed layer 300 is depicted as a dotted line in FIG. 11.

Figure 11:
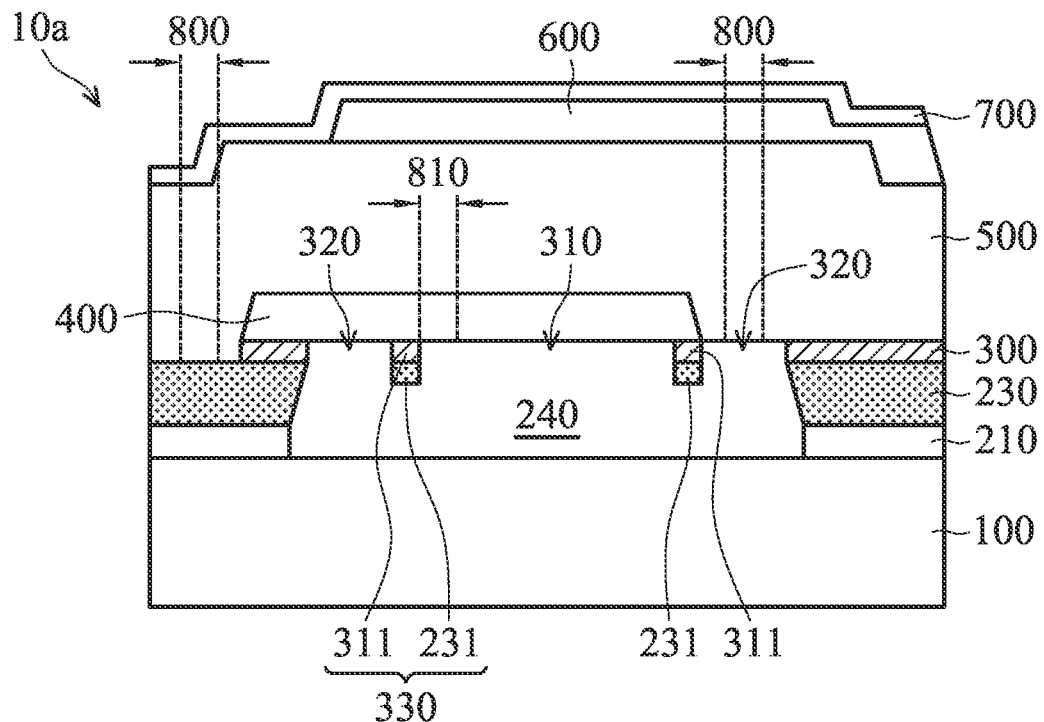
FIGS. 11-14 are schematic cross-sectional views of a bulk acoustic wave resonator, according to some embodiments of the present disclosure.

FIG. 11 illustrates a cross-sectional view of the bulk acoustic wave resonator 10*a* in accordance with some embodiments. In some embodiments, the top electrode 600 and the bottom electrode 400 partially overlap. In some embodiments, an area where the top electrode 600 is projected onto the substrate 100 is not fully inside an area where the bottom electrode 400 is projected onto the substrate 100. FIG. 11 depicts a conductive portion extended from the top electrode 600, the conductive portion can be used as a wiring. In some embodiments, another conductive portion extended from the bottom electrode 400, the another conductive portion can be also used as a wiring.

Figure 12:
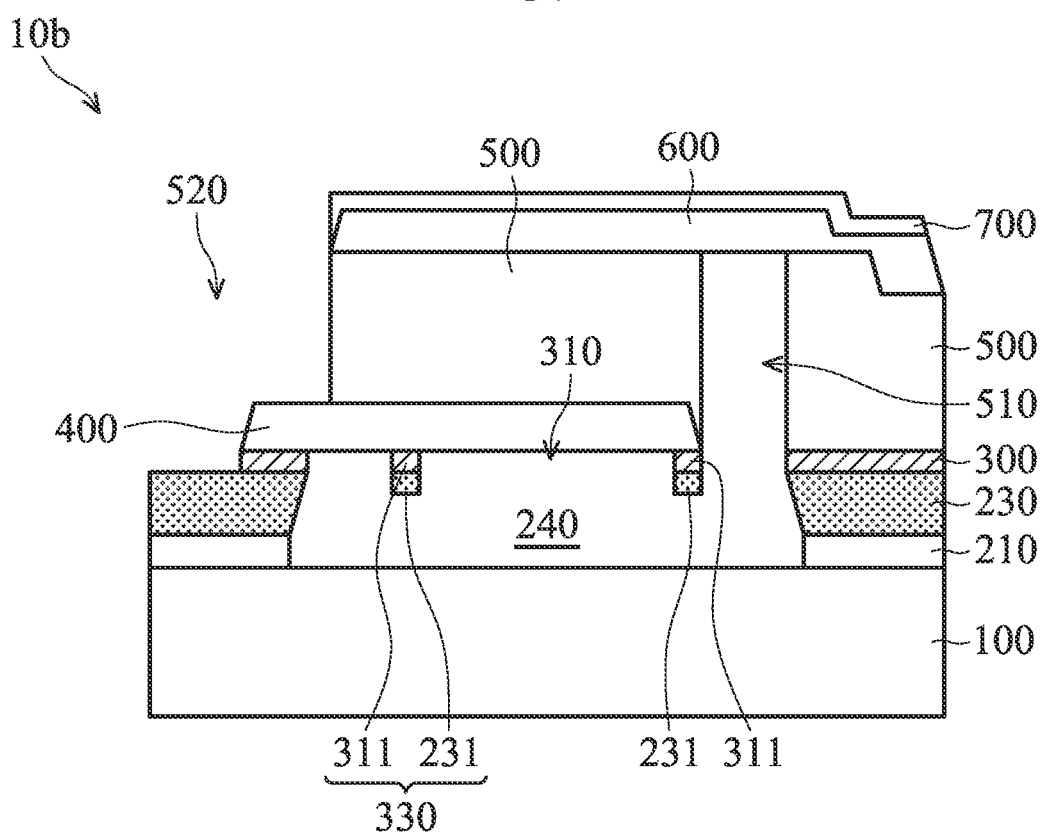

FIG. 12 illustrates a cross-sectional view of the bulk acoustic wave resonator 10*b*, in accordance with some embodiments. In some embodiments, the piezoelectric layer 500 is etched to form recesses outside the overlapping region of the bottom electrode 400, the piezoelectric layer 500, and the top electrode 600. The piezoelectric layer 500 may be etched from the top surface of the piezoelectric layer 500 or from the bottom surface of the piezoelectric layer 500. In some embodiments, the recesses are disposed adjacent to the active region of the bulk acoustic wave resonator.

In some embodiments, the piezoelectric layer 500 is etched to form the recess 510 through the cavity 240 and the opening 320. In some embodiments, the recess 510 is in communication with the cavity 240. In some embodiments, the etching process is performed from a bottom side of the resonator to form the recess 510 and is referred to as a bottom-up etching process. The process for etching the piezoelectric layer 500 to form the recess 510 may be the same as or different than the process used for etching the seed layer 300 and/or for etching the sacrificial structure 221. In some embodiments, the recess 510 exposes the bottom surface of the top electrode 600 as shown in FIG. 12. In some embodiments, the recess 510 is substantially aligned with the edge of the bottom electrode 400 to maintain the completeness of the bottom electrode 400.

In some embodiments, the piezoelectric layer 500 is etched from the top of the substrate 100 to form a recess 520 outside the overlapping region of the bottom electrode 400, the piezoelectric layer 500 and the top electrode 600. In some embodiments, the piezoelectric layer 500 is etched from its top surface. In some embodiments, the etching process is performed from the top side of the resonator to form the recess 520 and is referred to as a top-down etching process. In some embodiments, the recess 520 exposes the top surface of the bottom electrode 400. In some embodiments, the recess 520 is substantially aligned with an edge of the top electrode 600 to maintain the completeness of the top electrode 600.

Accordingly, the aforementioned recesses 510, 520 may surround the active area of the bulk acoustic wave resonator and be used as an air-edge to further reduce the acoustic loss of the bulk acoustic wave resonator 10*b*. Therefore, the quality factor may be further improved.

Figure 13:
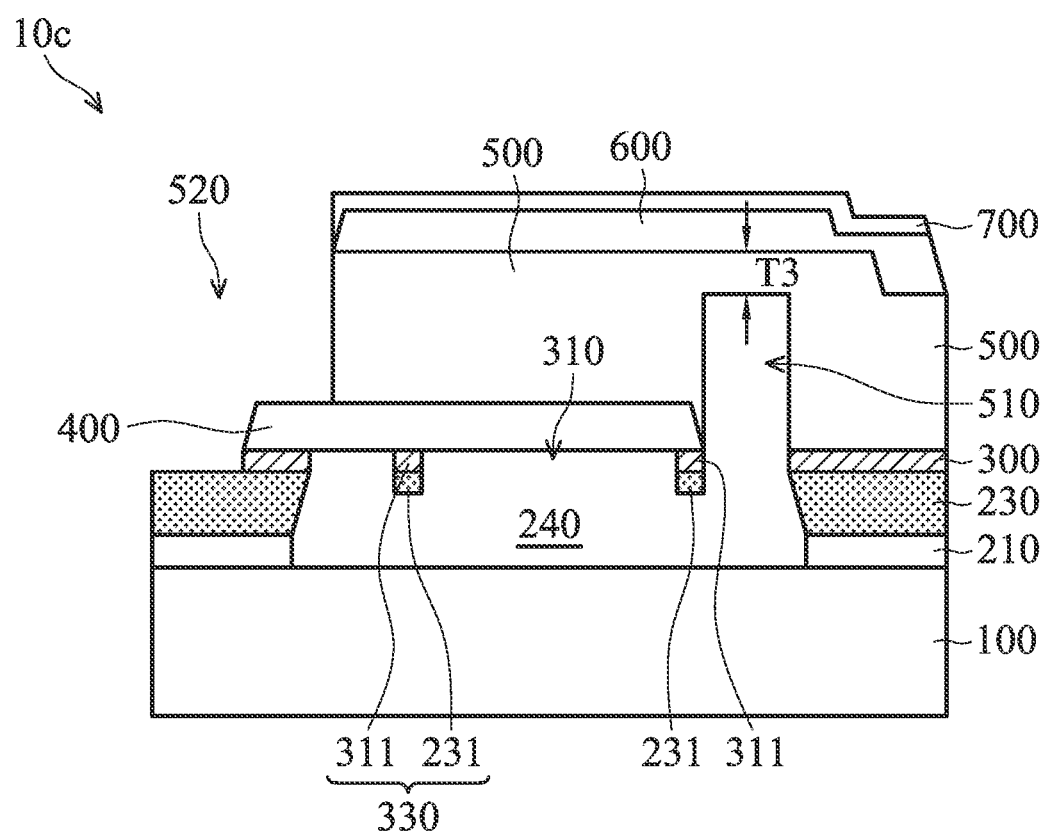

FIG. 13 illustrates a cross-sectional view of the bulk acoustic wave resonator 10*c*, in accordance with some embodiments. In some embodiments, the piezoelectric layer 500 is etched to form recess 510 not exposing the bottom surface of the top electrode 600. In some embodiments, a portion of the piezoelectric layer 500 directly above the recess 510 is left under the bottom surface of the top electrode 600, and it has a third thickness T3. The aforementioned portion of the piezoelectric layer 500 may improve the supporting force of the overlying features. The third thickness T3 may be adjusted based on the requirements of the supporting force.

Figure 14:
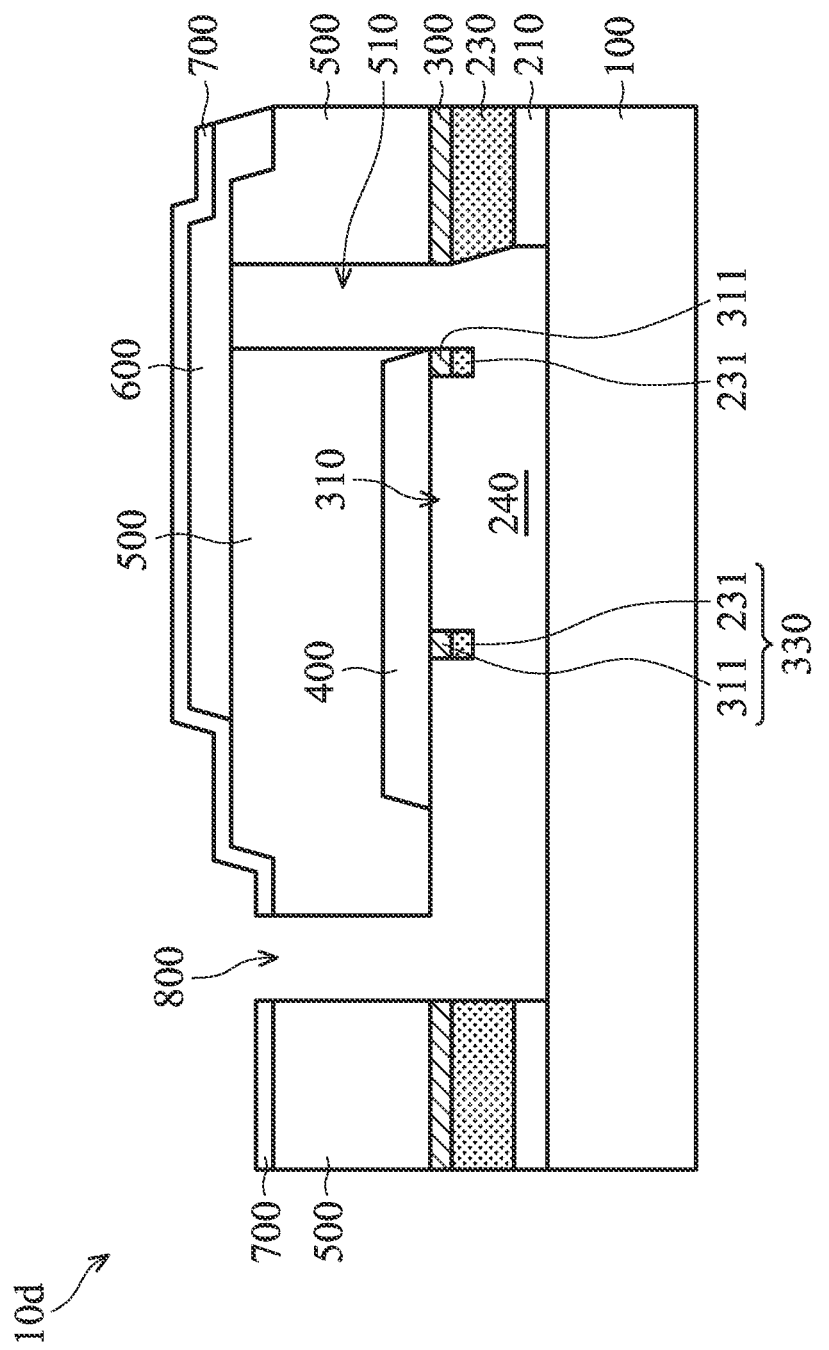

FIG. 14 illustrates a cross-sectional view of the bulk acoustic wave resonator 10*d* according to some embodiments of the present disclosure. In some embodiments, as shown in FIG. 14, the via hole 800 is in communication with the cavity 240 and the opening 310. In some embodiments, the manufacturing cost is reduced due to using the same via hole 800 as the etch channel to form the cavity 240, the opening 310, and/or the recess 510.

In summary, embodiments of the present disclosure selectively remove the seed layer 300 in the active region of the bulk acoustic wave resonator after forming the bottom electrode and the piezoelectric layer. Therefore, the quality factor and/or the electromechanical coupling coefficient of the bulk acoustic wave resonator may be improved without degrading the quality of the bottom electrode and the piezoelectric layer.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for changing, replacing, substituting and/or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A bulk acoustic wave resonator, comprising:
a substrate;
a seed layer disposed on the substrate;
a bottom electrode disposed on the seed layer;
a piezoelectric layer disposed on the bottom electrode;
a top electrode disposed on the piezoelectric layer;
wherein the substrate has a cavity thereon, and the seed layer has an opening exposing a bottom surface of the bottom electrode and a portion of a bottom surface of the piezoelectric layer, and communicating with the cavity,
wherein the bulk acoustic wave resonator further comprising via holes disposed on a region of the cavity outside the bottom electrode and the top electrode, and the via holes are in communication with the cavity and the opening.

2. The bulk acoustic wave resonator as claimed in claim 1, further comprising a frame under the bottom surface of the bottom electrode, wherein the frame comprises a portion of the seed layer.

3. The bulk acoustic wave resonator as claimed in claim 2, wherein the cavity is laterally surrounded by a supporting layer, and the frame further comprises a portion of the supporting layer.

4. The bulk acoustic wave resonator as claimed in claim 3, wherein the frame is a ring-shape from top view.

5. The bulk acoustic wave resonator as claimed in claim 4, wherein the ring-shape of the frame laterally surrounds a first portion of the opening, and a second portion of the opening is positioned outside the ring-shape of the frame.

6. The bulk acoustic wave resonator as claimed in claim 3, wherein the portion of the seed layer is disposed between the portion of the supporting layer and the bottom electrode.

7. The bulk acoustic wave resonator as claimed in claim 3, wherein the portion of the supporting layer has a first thickness, and the portion of the seed layer has a second thickness, wherein a ratio of the first thickness to the second thickness is in a range between 0.2 and 15.

8. The bulk acoustic wave resonator as claimed in claim 1, further comprising:
a recess in the piezoelectric layer and outside an overlapping region of the bottom electrode, the piezoelectric layer, and the top electrode.

9. The bulk acoustic wave resonator as claimed in claim 8, wherein the recess is in communication with the cavity.

10. The bulk acoustic wave resonator as claimed in claim 8, wherein the recess exposes a bottom surface of the top electrode or a top surface of the bottom electrode.

11. The bulk acoustic wave resonator as claimed in claim 8, wherein a portion of the piezoelectric layer is disposed between the recess and a bottom surface of the top electrode.

12. The bulk acoustic wave resonator as claimed in claim 8, wherein a sidewall of the recess is substantially aligned with an edge of the bottom electrode or an edge of the top electrode.

13. The bulk acoustic wave resonator as claimed in claim 1, wherein the cavity is laterally surrounded by a supporting layer.

14. The bulk acoustic wave resonator as claimed in claim 13, wherein the seed layer and the supporting layer are made of different materials.

15. The bulk acoustic wave resonator as claimed in claim 1, wherein the opening is between sidewalls of the bottom electrode.

16. The bulk acoustic wave resonator as claimed in claim 1, wherein the cavity has tapered sidewalls.

17. The bulk acoustic wave resonator as claimed in claim 1, wherein the top electrode partially overlaps with the bottom electrode.

18. The bulk acoustic wave resonator as claimed in claim 1, wherein the seed layer comprises AlN, AlON, $SiO_2$, $Si_3N_4$, SiC, AlScN, Ti, or a combination thereof.

* * * * *